United States Patent
Chase et al.

(10) Patent No.: US 7,118,991 B2
(45) Date of Patent: Oct. 10, 2006

(54) ENCAPSULATION WAFER PROCESS

(75) Inventors: Troy A. Chase, Kokomo, IN (US);
James H. Logsdon, Kokomo, IN (US);
James Kingery, Logansport, IN (US)

(73) Assignee: Delphi Technologies, Inc., Troy, MI (US)

( * ) Notice: Subject to any disclaimer, the term of this patent is extended or adjusted under 35 U.S.C. 154(b) by 178 days.

(21) Appl. No.: 10/708,936

(22) Filed: Apr. 1, 2004

(65) Prior Publication Data

US 2005/0227400 A1    Oct. 13, 2005

(51) Int. Cl.
*H01L 21/30* (2006.01)
*H01L 21/46* (2006.01)
*H01L 21/302* (2006.01)
*H01L 21/461* (2006.01)

(52) U.S. Cl. .................................. 438/456; 438/689

(58) Field of Classification Search ............... 438/106, 438/117, 456, 698, 759, 689; 257/684
See application file for complete search history.

(56) References Cited

U.S. PATENT DOCUMENTS

| 3,958,040 | A | 5/1976 | Webb | 427/94 |
| 5,493,470 | A | 2/1996 | Zavracky et al. | 438/53 |
| 5,631,428 | A | 5/1997 | Catanescu et al. | 73/724 |
| 6,528,724 | B1 | 3/2003 | Yoshida et al. | |
| 6,670,538 | B1 | 12/2003 | Wilner et al. | 136/230 |
| 6,723,250 | B1 * | 4/2004 | Schaefer et al. | 216/2 |
| 6,845,664 | B1 * | 1/2005 | Okojie | 73/431 |
| 6,913,701 | B1 * | 7/2005 | Moon et al. | 216/2 |

FOREIGN PATENT DOCUMENTS

EP    1 203 748    5/2002

OTHER PUBLICATIONS

Wolf et al., Silicon Processing for the VLSI Era, vol. 1, Lattice Press, 2000, pp. 265, 268.*
EP Search Report dated Feb. 17, 2006.

* cited by examiner

*Primary Examiner*—Carl Whitehead, Jr.
*Assistant Examiner*—Heather Doty
(74) *Attorney, Agent, or Firm*—Jimmy L. Funke

(57) ABSTRACT

A method of processing a wafer, and particularly a cap wafer configured for mating with a device wafer in the production of a die package. Masking layers are deposited on oxide layers present on opposite surfaces of the wafer, after which the masking layers are etched to expose regions of the underlying oxide layers. Thereafter, an oxide mask is formed on the exposed regions of the oxide layers, but is prevented from forming on other regions of the oxide layers masked by the masking layers. The masking layers are then removed and the underlying regions of the oxide layers and the wafer are etched to simultaneously produce through-holes and recesses in the wafer. The oxide mask is then removed to allow mating of the cap wafer with a device wafer.

5 Claims, 3 Drawing Sheets

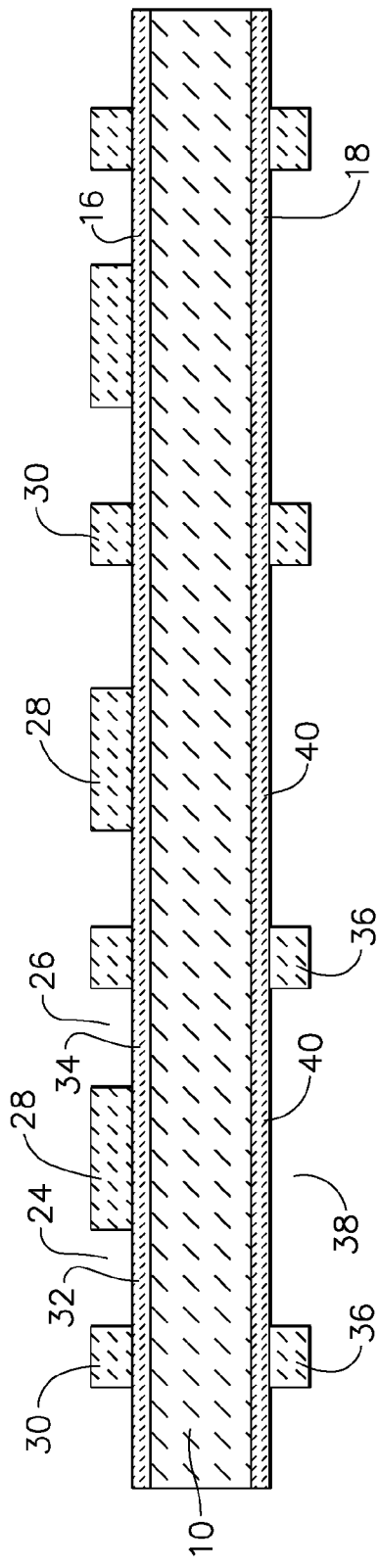
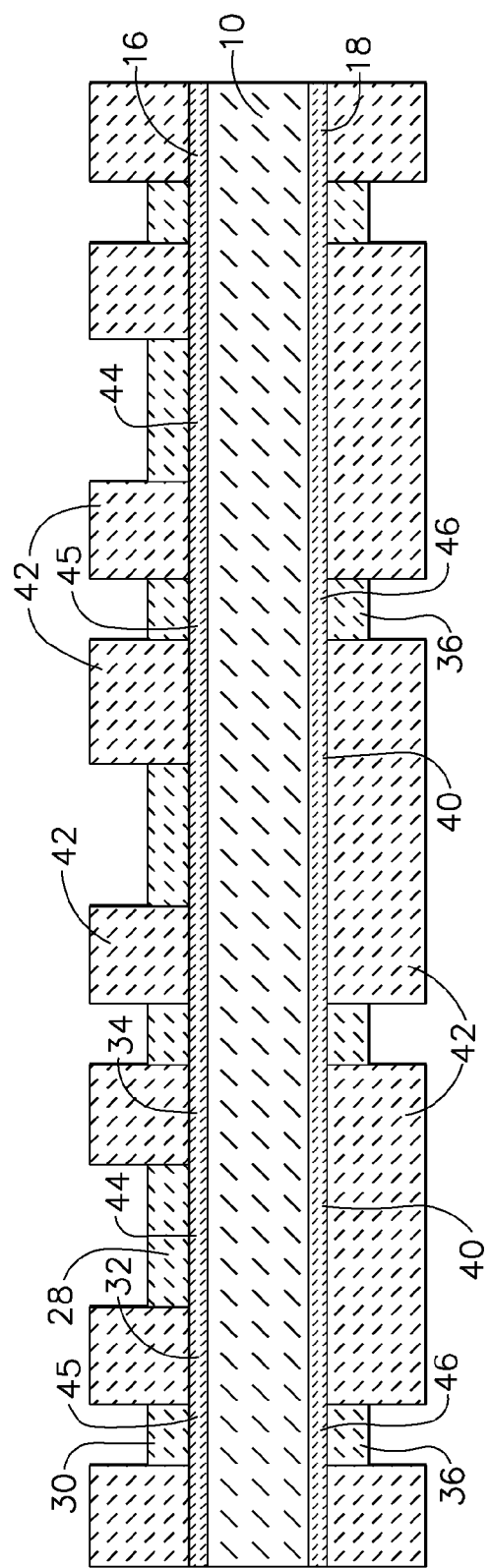

ENCAPSULATION WAFER PROCESS

BACKGROUND OF INVENTION

1. Field of the Invention

The present invention generally relates to processes for fabricating semiconductor devices. More particularly, this invention relates to a process of producing encapsulation die through a process that simultaneously forms cavities and through-holes in a semiconductor wafer and provides both quality and cost improvements over current techniques.

2. Description of the Related Art

Within the semiconductor industry, there are numerous applications that require encapsulating the surface of a semiconductor die. As an example, a microelectromechanical system (MEMS) device formed in or on a semi-conductor die (referred to herein as a device die) is often capped by a semiconductor or glass die (referred to herein as a cap die), forming a package that defines a cavity within which the MEMS device, such as a suspended diaphragm or mass, is enclosed and protected. Examples of MEMS devices protected in this manner include accelerometers, rate sensors, actuators, pressure sensors, etc.

For mass production, numerous MEMS devices are simultaneously fabricated in a device wafer that is bonded to an encapsulation (cap) wafer, after which the resulting wafer stack undergoes a dicing operation to singulate individual die packages from the wafers. The cavities are usually defined by recesses formed in the cap wafer by photolithographic/etch techniques. By the very nature of their operation, MEMS devices must be free to move to some degree, necessitating that the size and shape of the cavity within each package be adequate and consistently defined. However, current methods for processing cap wafers for MEMS devices are often plagued with yield loss and quality defects.

The difficulty in processing cap wafers revolves around the need to etch holes all the way through the cap wafer in order to provide access to bond pads on the device wafer. Existing processes utilize photolithographic/etch techniques to form the through-holes and recesses required by cap wafers. As is well known in the art, photolithography involves the use of light to effect the transfer of a pattern from a mask to a wafer, and using the pattern as a mask during etching of the wafer to define structural features, such as the holes and recesses in the cap wafer. Creating these through-holes using photolithographic/etch techniques requires processing both sides of the wafer and maintaining alignment of features on both sides. Inherently, photolithographical patterning of the wafers requires individual handling of the wafers through several steps to create the pattern on the wafer. If both surfaces of the cap wafer are being patterned, the patterned side of the wafer must be placed against wafer handling fixtures in order to process the opposite surface of the wafer, which further aggravates the quality control problem. As each wafer is subjected to additional processing steps requiring individual handling of the wafer, the chances of creating a defect increase. For example, photolithographical masking defects or scratches during the processing of the cap wafer are translated into the cap wafer during the through wafer etch, resulting in defects that can lead to the loss of individual die and even the entire wafer. Because processing of a wafer with an undesired through-hole typically cannot continue due to the adverse effect on equipment further along in the process, masking defects that result in the etching of such holes will result in the loss of the entire wafer, incurring a significant cost burden in the form of lost wafers, processing costs, and production time. Even small masking defects that do not create undesirable through-holes in the cap wafer can cause the loss of individual die. Because wafers are inspected by an automated system, the inspection process is likely to catch only those defects that are trained into the system, raising the potential that a defective die will pass the visual inspection.

In view of the above, any improvements in cap wafer processes over existing photolithographical techniques have the potential for providing quality, yield, and cost advantages.

SUMMARY OF INVENTION

The present invention is directed to a method of processing a wafer, and particularly a cap wafer configured for mating with a device wafer in the production of a die package. The method makes use of a semiconductor wafer having first and second oxide layers on oppositely-disposed first and second surfaces, respectively, thereof. First and second masking layers are then deposited on the first and second oxide layers, respectively, after which the first and second masking layers are etched using photolithographic/etch techniques to define first and second mask patterns, respectively. The masking layers are patterned such that the first and second mask patterns expose regions of the first and second oxide layers, including first and second regions of the first oxide layer and first regions of the second oxide layer. The first mask pattern masks third and fourth regions of the first oxide layer and the second mask pattern masks second regions of the second oxide layer, with the fourth regions of the first oxide layer being aligned with the second regions of the second oxide layer.

Thereafter, an oxide mask for a subsequent silicon etch is formed on the exposed first and second regions of the first oxide layer and the exposed first regions of the second oxide layer, but is prevented from forming on the third and fourth regions of the first oxide layer and the second regions of the second oxide layer as a result of the presence of the first and second masking layers. The first and second masking layers are then removed to expose the third and fourth regions of the first oxide layer and the second regions of the second oxide layer, after which the third and fourth regions of the first oxide layer and the second regions of the second oxide layer are removed to expose first, second and third regions, respectively, of the wafer. The first, second and third regions of the wafer are then etched, wherein etching of the first regions of the wafer produces recesses in the first surface of the wafer and etching of the second and third regions of the wafer produces through-holes in the wafer. The oxide mask is then removed to yield a cap wafer with multiple through-holes and recesses.

In view of the above process, it can be seen that masking operations to define the through-holes and recesses in the wafer are not required after the oxide mask is formed, such that the oxide mask serves to protect the cap wafer throughout the handling and etching of the wafer. Furthermore, once the oxide mask is in place, further processing of the wafer can be limited to batch-type operations with automated transfers therebetween, thereby greatly reducing the chance of damage to the oxide mask during subsequent processing. Because reduced risk of damage to the oxide mask translates directly to fewer wafer defects and better quality, fewer wafers will be lost to gross defects and nondefective wafers will be of superior quality.

Additionally, most defects that might occur during and following application and patterning of the masking layers will be "self healing." For example, if a scratch occurs in the mask patterns which is sufficiently deep to expose the underlying oxide layers of the wafer, the scratch will be filled by the oxide mask, so that the area under the scratch will be masked during the wafer etching step. Unless the feature created by the scratch is extremely large, etching of the wafer will not result in a defect being transferred to the wafer. For example, during an anisotropic etch, the wafer surface area beneath the oxide-filled scratch will be undercut so that the wafer surface area will still be removed as intended. On the other hand, if a defect in a mask pattern approaches the size of the features patterned in the mask pattern, the resulting feature etched in the cap wafer will have a smaller length and/or width dimension compared to the desired feature, and such a defect can be detected by an automated visual inspection.

Other objects and advantages of this invention will be better appreciated from the following detailed description.

BRIEF DESCRIPTION OF DRAWINGS

FIGS. 1 through 6 are cross-sectional views of processing steps carried out to produce a cap wafer in accordance with a preferred embodiment of this invention.

DETAILED DESCRIPTION

Figure 7:
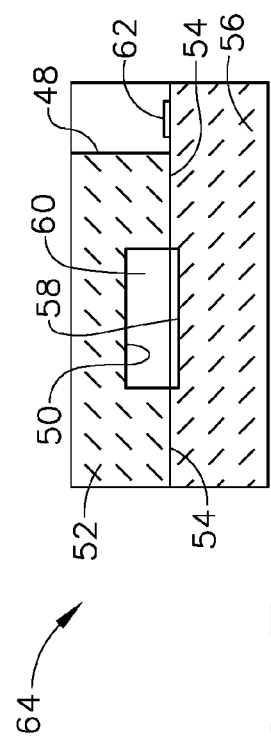
FIG. 7 represents a MEMS device package incorporating a cap die singulated from the cap wafer produced by the steps of FIGS. 1 through 6.

FIG. 7 represents a MEMS device package 64 formed by bonding a device die 56 to a cap die 52. The device die 56 is schematically represented as carrying a micromachined element 58 that is enclosed within a cavity 60 between the die 52 and 56. The device die 56 is typically formed of a semiconductor material such as silicon, preferably monocrystallographic silicon, though it is foreseeable that other materials could be used. The cap die 52 is also preferably formed of a semiconductor material. The micromachined element 58 can be of any desired type, such as a proof mass, resonating structure, diaphragm or cantilever that relies on capacitive, piezoresistive and piezoelectric sensing elements to sense acceleration, motion, pressure, etc., all of which are known in the art. As is conventional, the micromachined element 58 is electrically interconnected to bond pads 62 on the device die 56, such as with conductive runners (not shown) in the form of aluminum metallization. Through the bond pads 62, the micromachined element 58 and its associated sensing elements can be electrically interconnected with appropriate signal conditioning circuitry (not shown).

Figure 1:
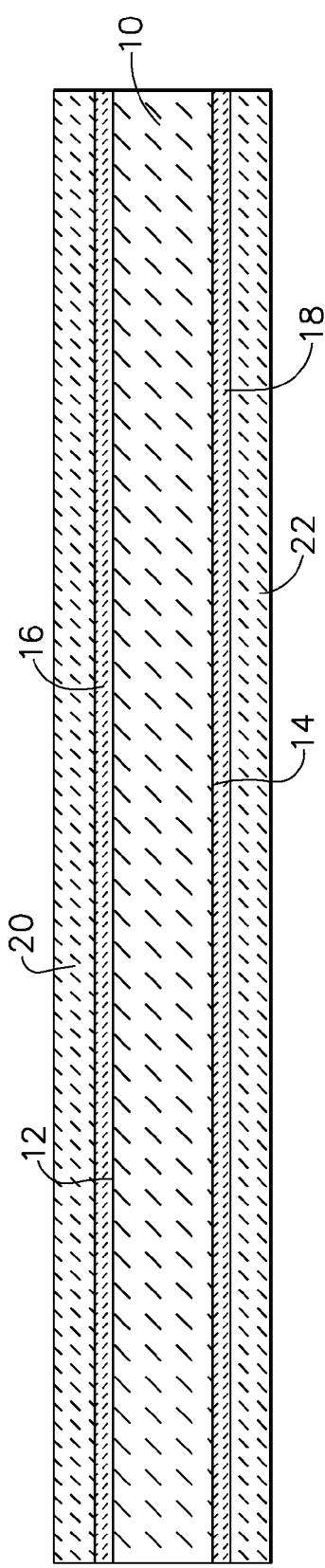

The cap die 52 is shown as having a recess 50 that defines the cavity 60 and a through-hole 48 that provides access to the bond pads 62 on the device die 56. According to a preferred aspect of this invention, the recess 50 and through-hole 48 are created by processing steps represented in FIGS. 1 through 6. Referring to FIG. 1, a wafer 10 is schematically represented as having two opposite surfaces 12 and 14, each of which is covered with an oxide layer 16 and 18. The wafer 10 is preferably a [100] p-type silicon wafer that has been is polished on both surfaces 12 and 14. For convenience, the sides of the wafer 10 at which the surfaces 12 and 14 are located will be referred to as the frontside and backside, though other terminology could be used. The wafer 10 is preferably sufficiently thick to permit handling while the lateral dimensions of the wafer 10 are generally large enough such that it can be subsequently diced into a number of individual chips, e.g., the cap die 52 in FIG. 7. As an example, a suitable thickness for a wafer 10 having a diameter of about 125 millimeters is about 380 to about 625 micrometers.

The oxide layers 16 and 18 are preferably thin oxide layers deposited or thermally grown in a conventional manner on the surfaces 12 and 14 of the wafer 10. Overlying the oxide layers 16 and 18 are films 20 and 22 of a material that will serve as a maskant for a subsequent oxidation step. A preferred material for the films 20 and 22 is silicon nitride ($Si_3N_4$), with a suitable thickness being about 1500 to about 2000 Angstroms. Other suitable materials for the films 20 and 22 include those that have a low oxidation rate relative to silicon and are compatible with semiconductor processing. A suitable process for depositing the films 20 and 22 is low pressure chemical vapor deposition (LPCVD). The oxide layers 16 and 18 between the silicon wafer surfaces 12 and 14 and the films 20 and 22 serve as barriers that allow the films 20 and 22 to be removed without removing any of the wafer 10. For this purpose, suitable thicknesses for the oxide layers 16 and 18 are on the order of about 200 to about 750 Angstroms.

Figure 2:
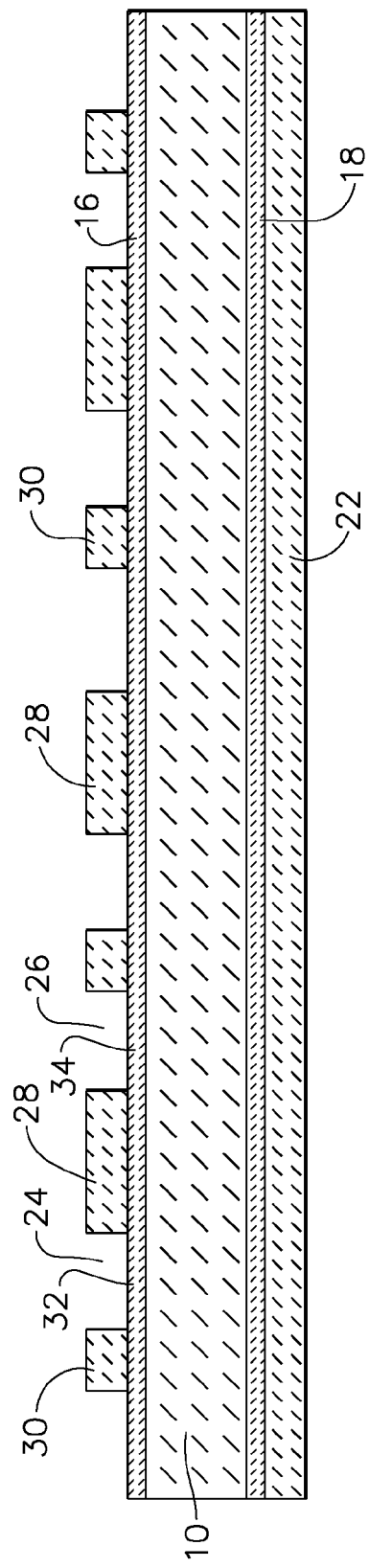

In FIG. 2 the silicon nitride film 20 on the frontside of the wafer 10 has been patterned and etched, while FIG. 3 shows the result of patterning and etching the silicon nitride film 22 on the backside of the wafer 10. The nitride films 20 and 22 are preferably etched using a dry etch. The etching operation produces openings 24, 26 and 38 in the nitride films 20 and 22 that expose underlying regions 32, 34 and 40, respectively, of the oxide layers 16 and 18. The remaining portions of the nitride films 20 and 22 define islands 28, 30 and 36 on the frontside and backside of the wafer 10. The islands 30 and 36 are aligned and correspond to the future locations of through-holes 48 in the wafer 10 (FIG. 5), and therefore the through-hole 48 in the cap die 52 of FIG. 7. The islands 28 on the frontside of the wafer 10 correspond to the future locations of recesses 50 in the wafer 10 (FIG. 5), and therefore the recess 50 in the cap die 52 of FIG. 7.

Following the patterning and etching steps of FIGS. 2 and 3, the wafer 10 undergoes oxidation to grow a thick field oxide 42 (FIG. 4) on the regions 32, 34 and 40 of the oxide layers 16 and 18 exposed by the openings 24, 26 and 38 patterned and etched in the nitride films 20 and 22. The field oxide 42 forms a continuous matrix that surrounds each of the individual islands 28, 30 and 36 of the nitride films 20 and 22. The field oxide 42 will serve as an etch mask during etching of the through-holes 48 and recesses 50, and as such needs to be sufficiently thick to protect the wafer 10 during the etch process. Suitable thicknesses will depend on the etch rate of oxide using a particular wet or dry etch process. For example, a thickness of at least 5000 Angstroms is desirable if using the preferred wet chemical anisotropic etchant tetramethyl ammonium hydroxide (TMAH).

Those skilled in the art will appreciate that the process of patterning and etching of the nitride films 20 and 22 to produce a mask for a subsequent thermally-grown oxide is a technique known as LOCOS (local oxidation of silicon), which is a standard MOS process. Certain processing parameters and techniques employed in LOCOS processes can be employed in the present invention, as long as they are not detrimental to the creation of the well-defined through-holes 48 and recesses 50 sought by the present invention.

Figure 5:
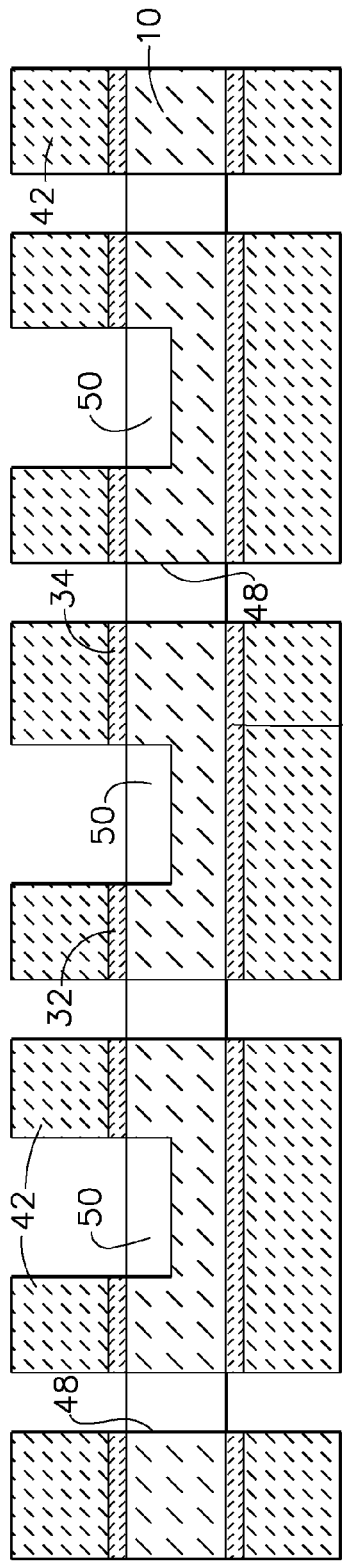

With the field oxide 42 in place, the islands 28, 30 and 36 of the nitride films 20 and 22 are removed, such as with the use of phosphoric acid ($H_3PO_4$), so as not to damage the field oxide 42. Removal of the islands 28, 30 and 36 exposes underlying regions 44, 45 and 46 of the oxide layers 16 and 18 that coincide in size and shape to the islands 28, 30 and 36, respectively. As such, the regions 45 and 46 are aligned and correspond to the future locations of the through-holes 48 in the wafer 10 (FIG. 5). The regions 44, 45 and 46 are etched, such as through the use of a BOE (buffered oxide etch) dip, to expose underlying surface regions of the wafer 10. The BOE dip removes some oxide from the surface of the field oxide 42 but not enough to destroy its usefulness as a mask. Using the field oxide 42 as a mask, the exposed wafer surface regions are etched to yield the structure represented in FIG. 5. As noted above, the wafer etch is preferably performed with the wet chemical anisotropic etchant TMAH. As a result of the wafer etch, the regions of the wafer 10 originally underlying the islands 30 and 36 of the nitride films 20 and 22 have been etched to form through-holes 48, while the regions of the wafer 10 originally underlying the islands 28 of the nitride film 20 have been etched to form recesses 50 in the surface 12 of the wafer 10.

Figure 6:
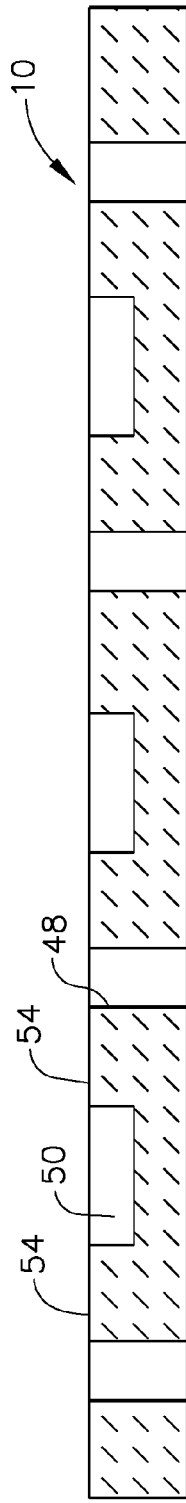

FIG. 6 shows the result of stripping the field oxide 42 and the remaining regions 32, 34 and 40 of the oxide avers 16 and 18 from both sides of the wafer 10, resulting in the wafer 10 comprising an array of cap die 52. Each cap die 52 comprises a through-hole 48, a recess 50, and a land 54 that completely surrounds the recess 50. The lands 54 subsequently serve as bonding surfaces for the cap wafer 10 when mated and bonded to a device wafer (not shown). When mated with the device wafer, the through-holes 48 can be aligned with bond pads (such as the bond pads 62 of FIG. 7) or any other feature on the device wafer to which access is desired. Simultaneously, the recesses 50 are aligned with regions of the device wafer on which elements are present that are desired to be encapsulated (such as the micromachined element 58 of FIG. 7). Thereafter, individual device packages (such as the package 64 in FIG. 7) can be sawn from the wafer stack produced by the wafer bonding operation. As known in the art, if the operation of the micromachined element 58 requires or benefits from operating in a vacuum, the cap wafer 10 can be bonded to the device wafer so that each cavity 60 defined by the recesses 50 forms a reference vacuum chamber.

In view of the above, it can be seen that the above processing steps offer several advantages over prior practices in which photolithographic techniques are used to define the through-holes and recesses in cap wafers. One notable advantage is that this process moves all the single wafer patterning steps ahead of the step that forms the field oxide 42 used as the mask to define the through-holes 48 and recesses 50. As such, the field oxide 42 is formed and then used without handling every wafer in the cassette. Another notable advantage is that the process is self healing to the extent that defects that might occur during patterning and etching of the nitride films 20 and 22 will not become etch defects in the wafer 10. Instead, any region exposed by a defect in the nitride films 20 and 22 and not in the islands 28, 30, and 36, will be eliminated when the nitride is patterned, while any defects in the nitride films 20 and 22 within the islands 28, 30, and 36 will become oxidized during growth of the field oxide 42. The use of an anisotropic etchant such as TMAH will cause most oxide islands present in such defects to be undercut, such that the original defect in the nitride film 20 or 22 will not detrimentally effect the desired dimensions of the through-holes 48 and recesses 50. On the other hand, only extremely large defects that are not undercut during the wafer etch are capable of leaving undesired silicon in the through-holes 48 and/or recess 50, and will cause only the effected die to be nonfunctional. As such, the process of this invention has the potential for dramatically improving the quality of cap wafers while also decreasing the manufacturing costs associated with producing these wafers.

While the invention has been described in terms of a preferred embodiment, it is apparent that other forms could be adopted by one skilled in the art. Accordingly, the scope of the invention is to be limited only by the following claims.

The invention claimed is:

1. A method of producing multiple MEMS device packages, the method comprising single wafer patterning steps and batch processing steps performed on a cap wafer wherein all single wafer patterning steps performed on the cap wafer precede the batch processing steps, the single wafer patterning steps comprising:
   providing the cap wafer with first and second oxide layers on oppositely-disposed first and second surfaces, respectively, thereof;
   depositing first and second masking layers on the first and second oxide layers, respectively;
   etching the first and second masking layers to define first and second mask patterns, respectively, the first and second mask patterns exposing regions of the first and second oxide layers, the exposed regions comprising first and second exposed regions of the first oxide layer and first exposed regions of the second oxide layer, the first mask pattern masking third and fourth regions of the first oxide layer and the second mask pattern masking second regions of the second oxide layer, the fourth regions of the first oxide layer being aligned with the second regions of the second oxide layer; and then
   growing an oxide mask on the first and second exposed regions of the first and second oxide layers, the first and second mask patterns preventing the oxide mask from forming on the third and fourth regions of the first oxide layer and the second regions of the second oxide layer;
the batch processing steps comprising:
   removing the first and second mask patterns to expose the third and fourth regions of the first oxide layer and the second regions of the second oxide layer;
   removing the third and fourth regions of the first oxide layer and the second regions of the second oxide layer to expose first, second and third surface regions, respectively, of the cap wafer between portions of the oxide mask;
   etching the first, second and third surface regions of the cap wafer, wherein etching of the first surface regions of the cap wafer produces multiple recesses in the first surface of the cap wafer and etching of the second and third surface regions of the cap wafer produces multiple through-holes in the cap wafer; and then
   removing the oxide mask and the first and second exposed regions of the first and second oxide layers thereunder;
the method then further comprising the steps of:
   mating the cap wafer with a device wafer so that the recesses of the cap wafer define cavities enclosing micromachined elements on the device wafer and the through-holes provide access to bond pads on the device wafer;
   bonding the cap wafer to the device wafer to form a wafer stack; and then
   singulating die from the wafer stack to produce the multiple MEMS device packages.

2. The method according to claim 1, wherein the first and second masking layers are formed of silicon nitride.

3. The method according to claim 1, wherein the cap wafer is a silicon wafer, the first and second oxide layers are silicon dioxide layers, and the oxide mask is formed of silicon dioxide grown by oxidizing the first and second exposed regions of the first oxide layer and the second exposed region of the second oxide layer.

4. The method according to claim 1, wherein the step of etching the first, second and third surface regions of the cap wafer to produce the through-holes and the recesses is an anisotropic etch.

5. The method according to claim 1, wherein a surface defect is present in at least one of the first and second mask patterns prior to the step of forming the oxide mask, the step of forming the oxide mask results in oxide forming in the defect, and the step of etching the first, second and third surface regions of the cap wafer causes the oxide in the defect to be undercut so as not to effect the sizes and shapes of the through-holes or recesses formed in the first, second and third surface regions of the cap wafer.

* * * * *